(12) United States Patent
Wang

(10) Patent No.: US 11,985,775 B2
(45) Date of Patent: May 14, 2024

(54) FLEXIBLE DISPLAY DEVICE

(71) Applicant: BOE TECHNOLOGY GROUP CO., LTD., Beijing (CN)

(72) Inventor: Xinyu Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 181 days.

(21) Appl. No.: 17/426,286

(22) PCT Filed: Sep. 3, 2020

(86) PCT No.: PCT/CN2020/113246
§ 371 (c)(1),
(2) Date: Jul. 13, 2022

(87) PCT Pub. No.: WO2022/047700
PCT Pub. Date: Mar. 10, 2022

(65) Prior Publication Data
US 2023/0225063 A1    Jul. 13, 2023

(51) Int. Cl.
*H05K 5/02* (2006.01)
*G06F 1/16* (2006.01)

(52) U.S. Cl.
CPC ......... *H05K 5/0217* (2013.01); *G06F 1/1652* (2013.01)

(58) Field of Classification Search
CPC .... H05K 5/0217; G06F 1/1652; G06F 1/1637
See application file for complete search history.

(56) References Cited

U.S. PATENT DOCUMENTS

| | | | | |
|---|---|---|---|---|
| 11,294,424 | B2* | 4/2022 | Shai | G06F 1/1652 |
| 2004/0183958 | A1* | 9/2004 | Akiyama | G09F 9/30 |
| | | | | 349/58 |
| 2011/0043976 | A1* | 2/2011 | Visser | G09F 9/301 |
| | | | | 361/679.01 |
| 2020/0192495 | A1* | 6/2020 | Lindblad | G09G 5/14 |
| 2021/0161023 | A1* | 5/2021 | Pyo | G06F 1/1652 |
| 2021/0272486 | A1* | 9/2021 | Khachatryan | G09F 9/301 |
| 2022/0141978 | A1* | 5/2022 | Yoon | H05K 5/0017 |
| | | | | 361/807 |

* cited by examiner

*Primary Examiner* — Sagar Shrestha
(74) *Attorney, Agent, or Firm* — Calfee, Halter & Griswold LLP

(57) ABSTRACT

The present disclosure relates to the field of display technology, and proposes a flexible display device. The flexible display device includes: a housing, with an opening provided thereon; a winding shaft, arranged in the housing; a flexible display panel, having one end connected to the winding shaft, and an opposite end extending out of the housing through the opening; a support member, having one end connected to the winding shaft, and an opposite end extending out of the housing through the opening, wherein the support member includes a plurality of support bars arranged side by side, and a length direction of the support bars is consistent with an axial direction of the winding shaft, and each of the support bars is provided with a through hole, and the through hole penetrates two end faces of a width direction of the support bars; a plurality of moving members.

13 Claims, 5 Drawing Sheets

FLEXIBLE DISPLAY DEVICE

RELATED APPLICATIONS

This application is the national stage entry of PCT/CN2020/113246, filed on Sep. 3, 2020, the entire contents of which are incorporated by reference in its entirety.

TECHNICAL FIELD

The present disclosure relates to the field of display technology, and in particular to a flexible display device.

BACKGROUND

With the advancement of science and technology and the development of society, flexible display panels have gradually come into eyes of consumers. Bendable and flexible display panels have brought consumers brand-new user experience while facilitating consumers' lives.

However, the existing flexible display panel support structure cannot fully support the flexible display panel after the unfolding to make that the flexible display panel will not bend. It should be noted that the information disclosed in the Background section above is only for enhancing the understanding of the background of the present disclosure, and thus may include information that does not constitute prior art known to those of ordinary skill in the art

SUMMARY

According to an aspect of the present disclosure, there is provided a flexible display device, including:
- a housing, with an opening provided thereon;
- a winding shaft, arranged in the housing;
- a flexible display panel, having one end connected to the winding shaft, and an opposite end extending out of the housing through the opening;
- a support member, having one end connected to the winding shaft, and an opposite end extending out of the housing through the opening, wherein the support member includes a plurality of support bars arranged side by side, and a length direction of the support bars is consistent with an axial direction of the winding shaft, and each of the support bars is provided with a through hole, and the through hole penetrates two end faces of the support bars in a width direction;
- a plurality of moving members, wherein at least a part of the through holes are provided with the moving members, and a dimension of the moving member in the width direction of the support bar is less than or equal to a width of the support bar;
- an adjustment mechanism, including a drawstring connected to the plurality of moving members successively, and the drawstring is able to drive the moving member to move, so as to adjust a position of the moving member in the through hole, to make the support member form a rigid plane to support the flexible display panel.

In an exemplary embodiment of the present disclosure, the adjustment mechanism further includes:
- a drawstring retractor, connected to the housing and arranged on a side of the opening away from the flexible display panel, wherein one end of the drawstring is connected to the drawstring retractor, and a pulling force of the drawstring retractor on the drawstring increases as an amount of pull-out of the drawstring.

In an exemplary embodiment of the present disclosure, the drawstring retractor includes: a rewinding shaft, connected to one end of the drawstring;
a first scroll spring, having one end fixed on the housing, and the other end fixedly connected to an end of the rewinding shaft.

In an exemplary embodiment of the present disclosure, the rewinding shaft is arranged perpendicular to the winding shaft, one end of the rewinding shaft is rotatably connected to the housing, and an opposite end of the rewinding shaft is connected to the first scroll spring.

In an exemplary embodiment of the present disclosure, the rewinding shaft is arranged parallel to the winding shaft, the first scroll spring is provided in two, and the two first scroll springs are correspondingly connected to opposite two ends of the rewinding shaft.

In an exemplary embodiment of the present disclosure, a groove for accommodating the drawstring is provided on a side of the support bar away from the flexible display panel.

In an exemplary embodiment of the present disclosure, the moving member is provided with a fifth through hole for the drawstring to pass through.

In an exemplary embodiment of the present disclosure, one end of the drawstring is fixed to a moving member closest to the winding shaft, and the drawstring passes through the fifth through hole on the plurality of moving members successively and is wound into the groove on the side of the support bar away from the flexible display panel, and the other end of the drawstring is fixed to the rewinding shaft.

In an exemplary embodiment of the present disclosure, a boss is provided in the through hole, and the boss is located on a side of the through hole away from the winding shaft, and a protrusion part is provided on the moving member, the protrusion part is provided on a side surface of the moving member close to a hole wall of the through hole and is located on a side close to the winding shaft, and the boss contacts the protrusion part to restrict a movement distance of the moving member.

In an exemplary embodiment of the present disclosure, a boss is provided in the through hole, and the boss is located on a side of the through hole close to the winding shaft, and a protrusion part is provided on the moving member, the protrusion part is provided on a side surface of the moving member close to a hole wall of the through hole and is located on a side close to the winding shaft, and the boss contacts the protrusion part to restrict a movement distance of the moving member.

In an exemplary embodiment of the present disclosure, the flexible display device further includes:
- a restoration mechanism, provided on one or two of the support member and the moving member, and the restoration mechanism is used to drive the moving member to move when the flexible display device is rolled up, so that the support member is able to curl.

In an exemplary embodiment of the present disclosure, the restoration mechanism includes: a first magnet, arranged on the boss, wherein the first magnet is located on a side of the support bar away from the winding shaft, and the first magnet is able to be attracted with the moving member in the through hole on the adjacent support bar on the side away from the winding shaft.

In an exemplary embodiment of the present disclosure, the restoration mechanism further includes:

a second magnet, arranged on the protrusion part, wherein the second magnet is located on a side of the moving member close to the winding shaft, and the second magnet is able to be attracted with the first magnet on the adjacent support bar on the side close to the winding shaft.

It should be noted that the above general description and the following detailed description are merely exemplary and explanatory, which cannot limit the present disclosure.

BRIEF DESCRIPTION OF THE DRAWINGS

The drawings herein are incorporated into the specification and constitute a part of the specification, show embodiments in accordance with the disclosure, and are used to explain the principle of the disclosure together with the specification. The drawings in the following description are only some embodiments of the present disclosure. For those of ordinary skill in the art, other drawings can be obtained based on these drawings without creative work.

Figure 1:
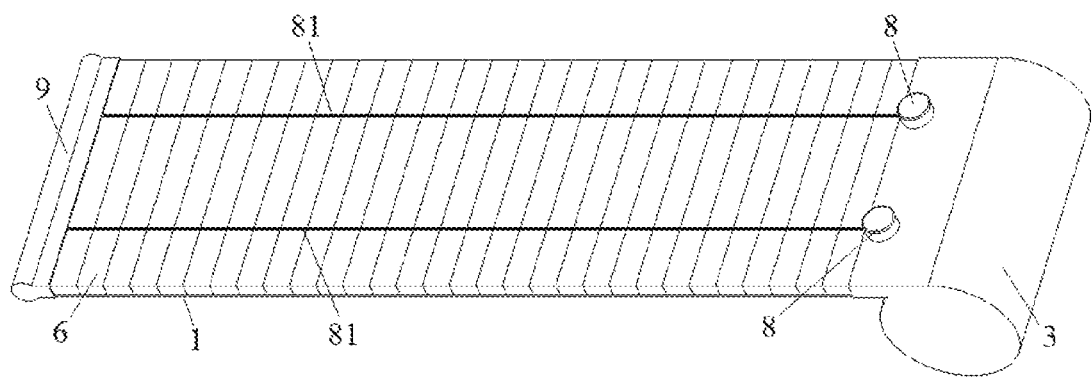
FIG. 1 is a schematic structural diagram of an exemplary embodiment of a flexible display device of the present invention.

The reference signs of the main components in the figures are explained as follows:

1. flexible display panel; 2. winding shaft;
3. housing; 31, cylinder; 32, end panel; 33, first connecting plate; 34, second connecting plate;
35, via hole; 36, housing body;
4. second scroll spring;
51, ratchet; 52, pawl; 53, handle;
6. support member; 61, support bar; 62, through hole; 621, first through hole; 622, second through hole; 63, first blind hole; 64, groove; 65, boss; 66, first magnet;
7. moving member; 71, first plate; 72, second plate; 73, second blind hole; 74, fifth through hole; 75, protrusion part; 76, second magnet;
8. adjusting mechanism; 81, drawstring; 82, drawstring retractor; 821, rewinding shaft; 822, first scroll spring; 823, sixth through hole.

DETAILED DESCRIPTION

Example embodiments will now be described more fully with reference to the accompanying drawings. However, the example embodiments can be implemented in various forms, and should not be construed as being limited to the embodiments set forth herein; on the contrary, these embodiments are provided so that the present invention will be comprehensive and complete, and fully convey the concept of the example embodiments to those skilled in the art. The same reference numerals in the figures indicate the same or similar structures, and thus their detailed descriptions will be omitted.

This exemplary embodiment provides a flexible display device. Referring to the schematic structural diagrams of an exemplary embodiment of the flexible display device of the present invention shown in FIGS. 1 to 10, the flexible display device may include a housing 3, a winding shaft 2, a flexible display panel 1, a support member 6, an adjustment mechanism 8, and a plurality of moving members 7. An opening is provided on housing 3. The winding shaft 2 is arranged in the housing 3. The flexible display panel 1 has one end connected to the winding shaft 2, and an opposite end extending out of the housing 3 through the opening. The support member 6 has one end connected to the winding shaft 2, and an opposite end extending out of the housing 3 through the opening, wherein the support member 6 includes a plurality of support bars 61 arranged side by side, and a length direction of the support bars 61 is consistent with an axial direction of the winding shaft 2, and each of the support bars 61 is provided with a through hole 62, and the through hole 62 penetrates two end faces of the support bars 61 in a width direction. At least a part of the through holes 62 are provided with the moving members 7, and a dimension of the moving member 7 in the width direction of the support bar 61 is less than or equal to a width of the support bar 61. The adjustment mechanism 8 includes a drawstring 81 connected to the plurality of moving members 7 successively, and the drawstring 81 is able to drive the moving member 7 to move, so as to adjust a position of the moving member 7 in the through hole 62, to make the support member 6 form a rigid plane to support the flexible display panel 1.

In the flexible display device of this exemplary embodiment, the moving member 7 is driven to move by the drawstring 81 to adjust the position of the moving member 7 in the through hole 62, so that the support member 6 forms a rigid plane to support the flexible display panel 1. "Rigid" herein is opposite to "flexible", that is, the rigid plane cannot be curved or bent, to achieve complete support for the unfolded flexible display panel 1, and the flexible display device has a simple structure and is easy to operate.

In this exemplary embodiment, being close to the winding shaft 2 or away from the winding shaft 2 means that the flexible display device is in an unfolded state. The length refers to the dimension along the axial direction of the winding shaft 2, and the width refers to the dimension in the direction perpendicular to the axial direction of the winding shaft 2.

Figure 2:
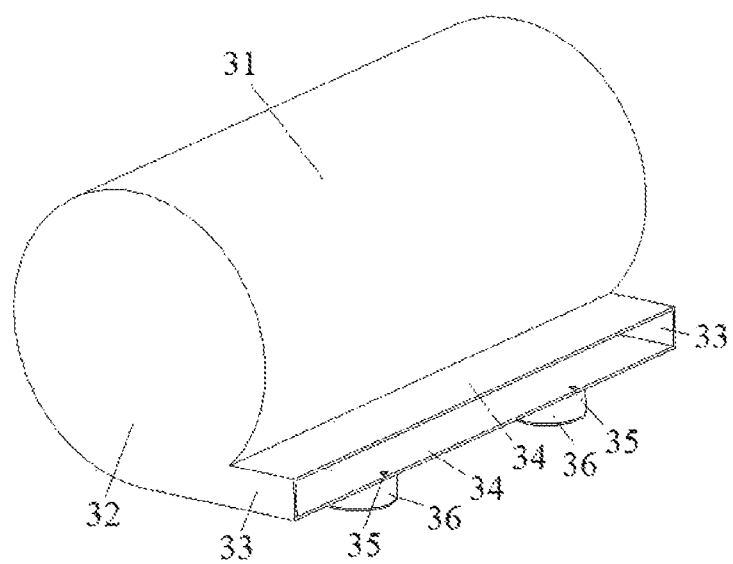
FIG. 2 is a schematic diagram of the structure of the housing in FIG. 1.

In this exemplary embodiment, referring to the structural diagram of the housing 3 shown in FIG. 2, the housing 3 may be configured to be cylindrical, that is, the housing 3 may include a cylinder 31 and end panels 32 provided at opposite two ends of the cylinder 31. The cylinder 31 is provided with a rectangular opening. The length direction of the opening is arranged along the axial direction of the housing 3, the width of the opening is greater than the sum of the thickness of the flexible display panel 1 and the maximum thickness of the support member 6, and the length of the opening is greater than that of the support member 6, the length of the support member 6 is greater than or equal to the length of the flexible display panel 1, so that the support member 6 and the flexible display panel 1 can be unfolded or rolled smoothly through the opening. Two first connecting plates 33 and two second connecting plates 34 are connected on four edges of the opening. The two first connecting plates 33 are arranged oppositely and parallel to each other. The two second connecting plates 34 are arranged oppositely and parallel to each other. The two first connecting plates 33 and the two second connecting plates 34 surround to form a rectangular channel, and the support member 6 and the flexible display panel 1 can pass through the channel smoothly. The two first connecting plates 33 and the end panel 32 of the housing 3 are connected to form a plane. One of the two second connecting plates 34 is smoothly connected to the cylinder 31, and a through hole 35 is provided on the second connecting plate 34. A housing 36 is provided on a side of the second connecting plate 34 away from the flexible display panel 1. A drawstring retractor 82 is arranged in the housing 36, that is, the drawstring retractor 82 is located on a side of the opening away from the flexible display panel 1. This arrangement can make the housing 3 stable. In addition, in other embodiments of the present invention, the housing 3 may also be configured as a square column or an elliptical column, etc.; and the connecting plate may also not be provided.

Figure 3:
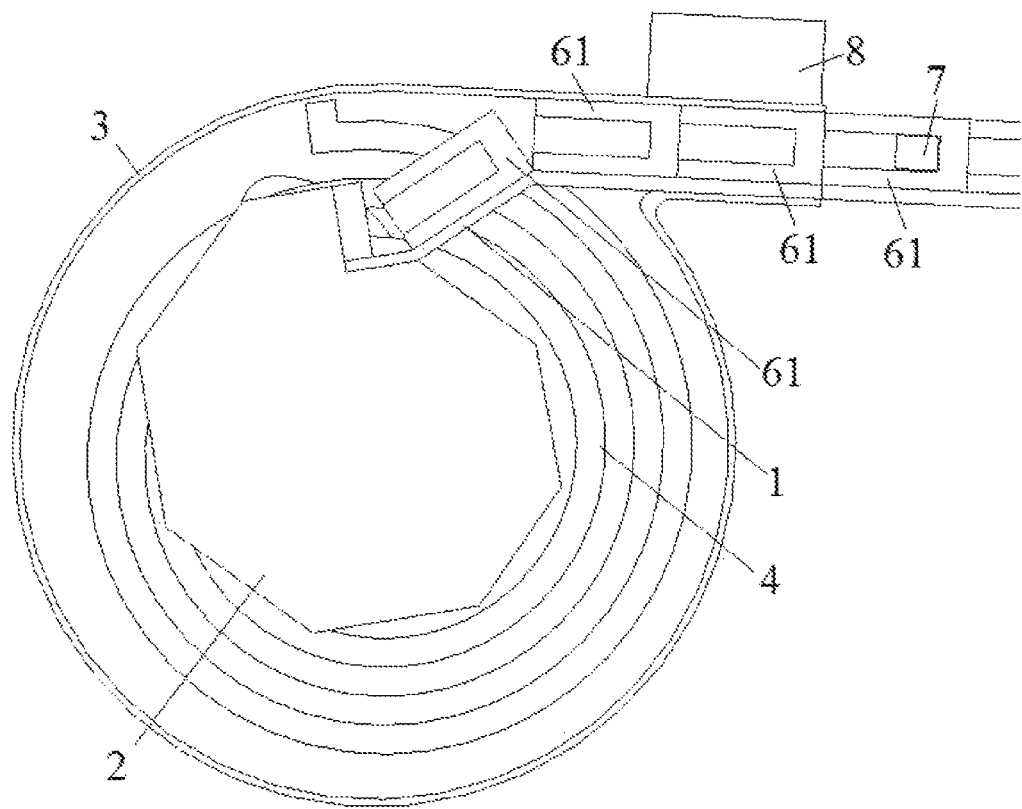
FIG. 3 is a schematic cross-sectional view at the housing in FIG. 1.

In this exemplary embodiment, referring to the schematic cross-sectional view of the housing in FIG. 1 shown in FIG. 3, a winding shaft 2 is rotatably provided in the housing 3. Specifically, the cross-sectional shape of the winding shaft 2 perpendicular to the axial direction may be an involute octagon. One side of the octagon is set in a stepped shape, and the side close to the central axis is the starting side of the involute, the side away from the central axis is the end side of the involute. The flexible display panel 1 can be bonded on the plane of the winding shaft 2 formed by the starting side. The side of the flexible display panel 1 at this position away from the winding shaft 2 may not be provided with the support member 6, and the side of the flexible display panel 1 outside this position away from the winding shaft 2 may be provided with the support member 6. The side length of the octagon may be equal to the width of the support bar 61, such that the support bar 61 and the flexible display panel 1 are wound on the winding shaft 2 also in an involute shape. "Involute" means that the sides of an octagon gradually expand like an involute. The winding shaft 2 can be set as a cylindrical shaft; it can also be set as a prismatic shaft, and the sides of the prism can be three, four or more; it can also be set as the above-mentioned involute shape, and the number of sides can be less than eight or more, which will not be repeated herein.

In this exemplary embodiment, the moving member 7 is not provided in the through holes 62 of the three support bars 61 at one end of the support member 6 connected to the winding shaft 2, so that a part of the support member 6 located in the housing 3 can be freely curled. It can be set according to needs such that only one, two, four or more through holes 62 of the support bars 61 are not provided with the moving member 7.

Figure 4:
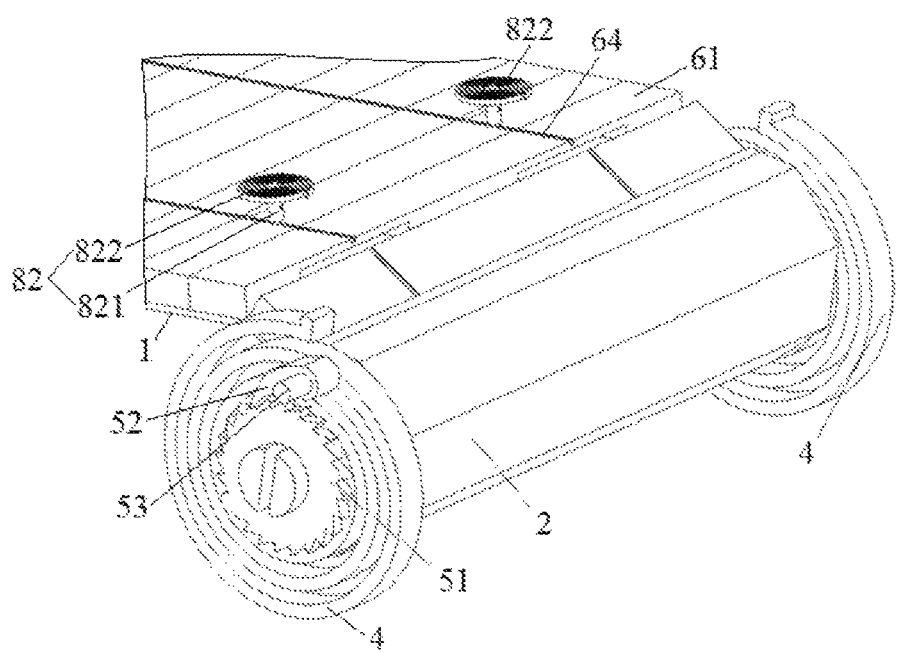
FIG. 4 is a schematic diagram of a partial structure of the flexible display device with the housing removed.

Referring to the partial structural schematic diagram of the flexible display device with the housing 3 removed as shown in FIG. 4, second scroll springs 4 are respectively provided at two ends of the winding shaft 2, that is, a total of two second scroll springs 4 are provided. One end of the second scroll spring 4 is fixedly connected to the inner wall of the cylinder 31, and the other end of the second scroll spring 4 is fixed to the end of the winding shaft 2. When the flexible display panel 1 and the support member 6 are pulled out by a force, the winding shaft 2 rotates, and the two second scroll springs 4 are also pulled to rotate, thereby generating a certain roll-up force. After completing the use, when the flexible display panel 1 and the support member 6 are relaxed, the two second scroll springs 4 drive the winding shaft 2 to rotate in a reverse direction under the action of the roll-up force, and drive the flexible display panel 1 and the support member 6 to roll up and wind on the winding shaft 2. It can be understood that the cross-sectional shape of the winding shaft 2 perpendicular to its axial direction can be cylindrical, elliptical, quadrilateral, pentagonal, and other polygons. The winding shaft 2 can also be connected to the housing 3 through a bearing, without providing the second scroll spring 4, which allows the winding shaft 2 to rotate relative to the housing 3.

In this exemplary embodiment, please continue to refer to FIG. 4, a ratchet and pawl mechanism may also be provided at one end of the winding shaft 2. When the flexible display panel 1 and the support member 6 are pulled out by a force, the ratchet 51 rotates with the winding shaft 2, the pawl 52 slides on the tooth back of the ratchet 51. When the flexible display panel 1 and the support member 6 are stretched in place, the pawl 52 is inserted into the tooth groove of the ratchet 51, so that the ratchet 51 cannot continue to rotate, thereby keeping the unfolded size of the flexible display panel 1 and the support member 6. There is no need to manually apply a pulling force to maintain the unfolded state of the flexible display panel 1 and the support member 6 at this time. The pawl 52 can also be provided with a handle 53. The handle 53 extends out of the housing 3, when the roll-up is needed, the handle 53 can be manually pulled, to separate the pawl 52 from the ratchet 51. At this time, under the action of the roll-up force of the second scroll spring 4, the flexible display panel 1 and the support member 6 are driven to roll up and wind on the winding shaft 2. The unfolding position of the flexible display panel 1 can be locked by the ratchet and pawl mechanism.

In this exemplary embodiment, one end of the support member 6 is connected to the winding shaft 2, and the opposite end of the support member 6 protrudes out of the housing 3 through the opening. Please continue to refer to FIG. 1, the opposite end of the support member 6 may also be connected with a tie rod 9. The tie rod 9 is also connected to the opposite end of the flexible display panel 1. The length direction of the tie rod 9 is also consistent with the axial direction of the winding shaft 2. The user can hold the pull rod 9 to pull out the support member 6 and the flexible display panel 1. The support member 6 can extend out of the opening through the opening, to support the flexible display panel 1 extending out of the opening. The support member 6 can also be rolled into the housing 3 through the opening and wound on the winding shaft 2.

Please continue to refer to FIG. 1, the support member 6 may include a plurality of support bars 61 arranged side by side in parallel. The support bars 61 are arranged in a rectangular bar shape, and the length direction of the support bars 61 is consistent with the axial direction of the winding shaft 2. The plurality of support bars 61 can form a plane to support the flexible display panel 1. The sum of the widths of the plurality of support bars 61 is the width of the support member 6. The length and width directions of the support bars 61 are both parallel to the unfolded flexible display panel 1. The height or thickness of the support bars 61 is perpendicular to the unfolded flexible display panel 1. As for the support bar 61 and the support member 6, the size in the axial direction of the winding shaft 2 can be set as the length.

Figure 5:
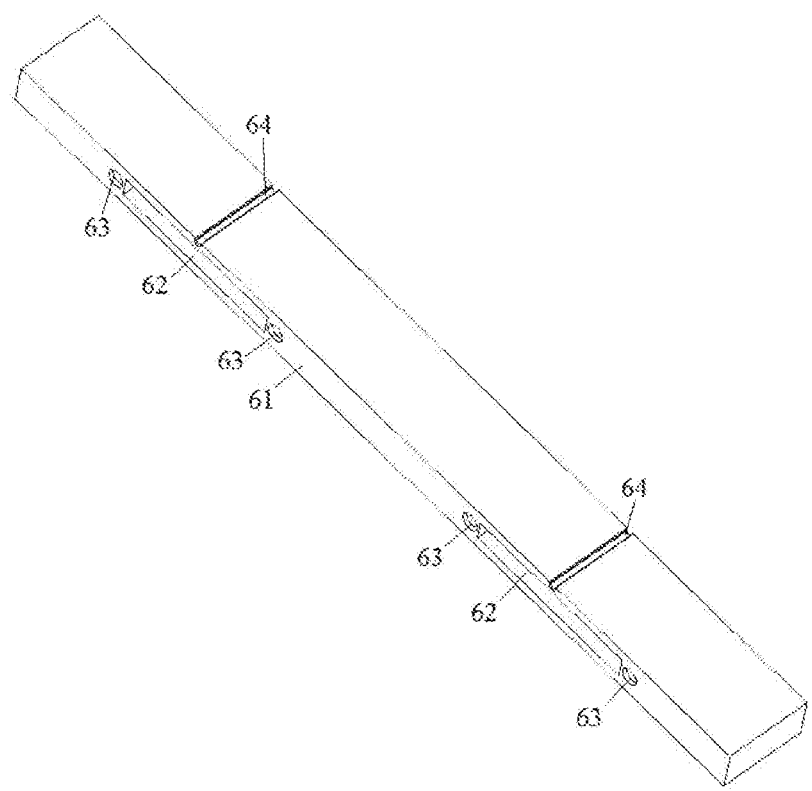
FIG. 5 is a schematic diagram of the structure of the support bar in FIG. 1.
Figure 6:
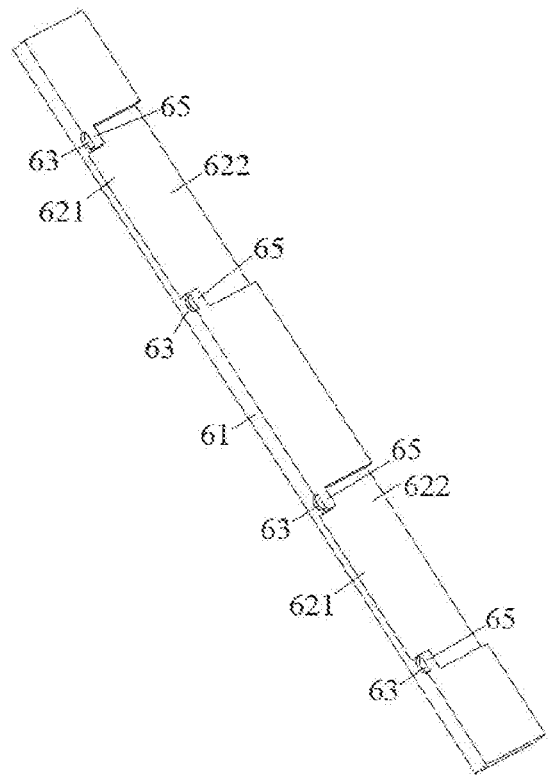
FIG. 6 is a schematic cross-sectional view of FIG. 5.

Referring to the structural schematic diagrams of the support bar 61 shown in FIG. 5 and FIG. 6, the cross-sectional surface of FIG. 6 is parallel to the flexible display panel. In this exemplary embodiment, two through holes 62 are provided on the support bar 61, and the through holes 62 penetrate both end surfaces of the support bar 61 in the width direction. Preferably, the depth direction of the through hole 62 is the same as the width direction of the support bar 61. That is, the depth direction of the through hole 62 is perpendicular to the axial direction of the winding shaft 2.

A boss 65 is provided in the through hole 62, and the boss 65 is located on the side of the through hole 62 away from the winding shaft 2, that is, the through hole 62 may be set as a stepped hole. Specifically, the through hole 62 may include a first through hole 621 with a rectangular cross-sectional shape and a second through hole 622 with a rectangular cross-sectional shape. The first through hole 621 and the second through hole 622 are arranged with the same central axis, so that the first through hole 621 and the second through hole 622 communicate to form the through hole 62. The first through hole 621 is located on the side of the support bar 61 away from the winding shaft 2. The length of the first through hole 621 is smaller than the length of the second through hole 622, so that two bosses 65 are formed at both ends of the first through hole 621. The width of the first through hole 621 is smaller than the width of the second through hole 622, and the height of the first through hole 621 is equal to the height of the second through hole 622. In other exemplary embodiments of the present invention, the first through hole 621 and the second through hole 622 may be round stepped holes, elliptical stepped holes, or the like.

In this example embodiment, the flexible display device may further include a restoration mechanism, which may be provided on one or both of the support member 6 and the moving member 7. The restoration mechanism is used to drive the moving member 7 to move when the flexible display device is rolled, so that the support member 6 can be curled. The restoration mechanism may include a first magnet 66 provided on the boss 65 and a second magnet 76 provided on the protrusion part 75.

Specifically, since the length of the first through hole 621 is smaller than the length of the second through hole 622, a boss 65 is respectively formed on both sides of the first through hole 621. A first blind hole 63 is provided on the boss 65, that is, a first blind hole 63 is respectively provided on both sides of the through hole 621. The axial direction of the first blind hole 63 is consistent with the axial direction of the first through hole 621. The first blind hole 63 is located on a side of the support bar 61 away from the winding shaft 2. A first magnet 66 can be installed in the first blind hole 63. The first magnet 66 can be attracted with the moving member 7 in the through hole 62 on the adjacent support bar 61 on the side away from the winding shaft 2. The first blind hole 63 may also not be provided, and the first magnet 66 may be directly bonded on the side of the boss 65 away from the winding shaft 2. Two grooves 64 are provided on the side of the support bar 61 away from the flexible display panel 1. The extending direction of the grooves 64 is consistent with the width direction of the support bar 61. That is, the extending direction of the grooves 64 is perpendicular to the axial direction of the winding shaft 2. In addition, the central axis of the groove 64 and the central axis of the through hole 62 are arranged directly opposite to each other.

Figure 7:
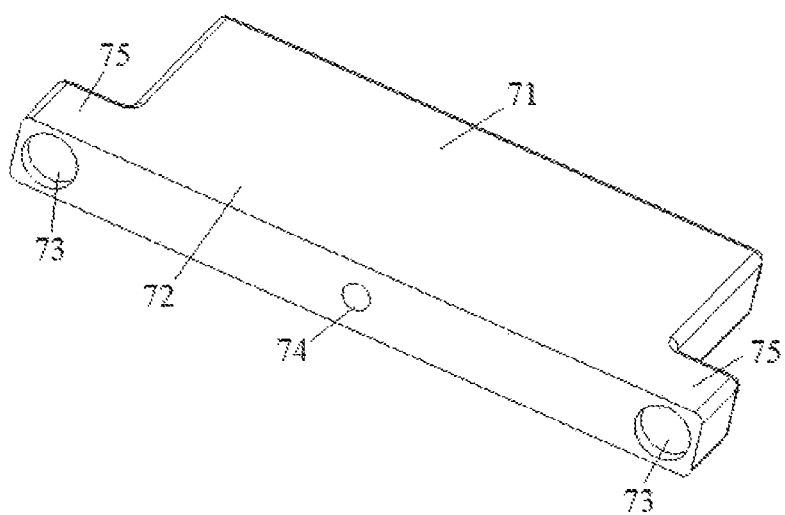
FIG. 7 is a schematic view of the structure of the moving member.

Referring to the structural schematic diagram of the moving member 7 shown in FIG. 7, in this exemplary embodiment, the width of the moving member 7 is equal to the width of the support bar 61, so that one moving member 7 can be completely located in one through hole 62. The width of the moving member 7 may also be smaller than the width of the support bar 61.

A protrusion part 75 is provided on the moving member 7, the protrusion part 75 is provided on a side surface of the moving member 7 close to a hole wall of the through hole 62 and is located on a side close to the winding shaft 2. Specifically, the moving member 7 may include a first plate 71 and a second plate 72. The first plate 71 is connected to the second plate 72. A width of the first plate 71 is greater than a width of the second plate 72, and a thickness of the first plate 71 is equal to a thickness of the second flat plate 72. A length of the first flat plate 71 is smaller than a length of the second flat plate 72, so that both ends of the second flat plate 72 protrude from the first flat plate 71, to form protrusion parts 75. Second blind holes 73 are provided on both ends of the second plate 72 protruding from the first plate 71. That is, the second blind hole 73 is provided on the protrusion part 75. The axial direction of the second blind hole 73 is consistent with the axial direction of the first blind hole 63. The second blind hole 73 is located on the side of the moving member 7 close to the winding shaft 2. A second magnet 76 can be installed in the second blind hole 73. The second magnet 76 is able to be attracted with the first magnet 66 on the adjacent support bar 61 on the side close to the winding shaft 2. A fifth through hole 74 is also provided on the moving member 7. The fifth through hole 74 is arranged with the same central axis as the moving member 7. That is, the axial direction of the fifth through hole 74 is consistent with the axial direction of the first blind hole 63. The second blind hole 73 may not be provided, but the second magnet 76 is directly bonded to the side of the protrusion part 75 close to the winding shaft 2.

In addition, in other exemplary embodiments of the present invention, only one of the first magnet 66 and the second magnet 76 may be provided. In this case, the support bar 61 or the moving member 7 without a magnet needs to be set as a magnetic body, so as to be attracted with the first magnet 66 or the second magnet 76. It is also possible to provide a magnetic body at the position attracted to the first magnet 66 or the second magnet 76, which can also achieve the function of attracting. For example, only the first magnet 66 may be provided. The first magnet 66 is located on the side of the support bar 61 away from the winding shaft 2. The first magnet 66 can be attracted with the moving member 7 in the through hole 62 on the adjacent support bar 61 on the side away from the winding shaft 2 or the magnetic body on the moving member 7. Moreover, the specific structure of the restoration mechanism is not limited to the above description. For example, the restoration mechanism may include an extension spring. One end of the extension spring may be fixed on the side of the connecting member 7 closest to the winding shaft 2 close to the winding shaft 2. The other end of the extension spring may be fixed in the through hole of the support bar 61 on the side close to the winding shaft 2. The extension spring is pulled apart during the unfolding, the extension spring generates a retracting force, and the retracting force of the extension spring pulls the moving member 7 back during the roll-up.

Figure 8:
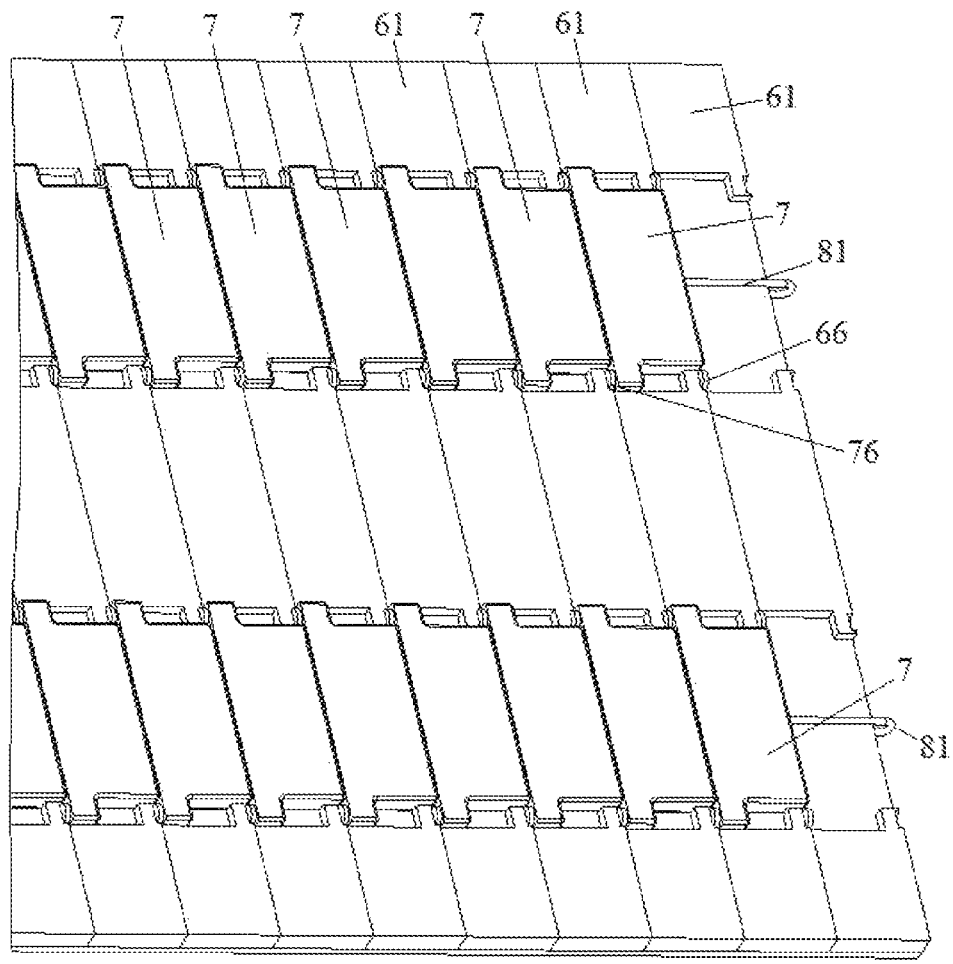
FIG. 8 is a schematic cross-sectional view of the matching structure of the moving member and the support bar when the flexible display device is not fully stretched.

Referring to the schematic cross-sectional view of the matching structure of the moving member and the support bar when the flexible display device is not fully stretched as shown in FIG. 8, the cross-sectional surface of FIG. 8 is parallel to the flexible display panel 1. When the flexible display device is in an incompletely stretched state, a moving member 7 is located in the through hole 62 of a support bar 61, so that the support member 6 can be bent at will. In this exemplary embodiment, the length of the first plate 71 is equal to the length of the first through hole 621, the width of the first plate 71 is greater than the width of the first through hole 621, and the first plate 71 cooperates with the first through hole 621. The length of the second plate 72 is equal to the length of the second through hole 622, the width of the second plate 72 is smaller than the width of the second through hole 622, and the second plate 72 cooperates with the second through hole 622. Therefore, the moving member 7 can move along the axial direction of the through hole 62 in the through hole 62. Besides, the bosses 65 on both sides of the first through hole 621 can abut against the second protrusion part 75 to limit the position of the moving member 7, which prevents the moving member 7 from being completely separated from the through hole 62. The support bar 61 and the moving member 7 in FIG. 8 are cross-sectional views cut along the center line, not a complete support bar, which aims to more intuitively introduce the positional relationship and movement principle of the internal structure of the support member.

In this exemplary embodiment, the moving member 7 is not provided in the through hole 62 of the support bar 61 at the opposite end of the support member 6. That is, the through hole 62 of the support bar 61 at the outermost side of the support member 6 at the opposite end is not provided with the moving member 7, so that the moving member 7 in another support bar 61 close to the support bar 61 extends into the through hole 62 of the support bar 61 when the flexible display device is in the unfolded state, so as to realize the full support of the flexible display panel 1. According to the width of the support member and the display panel, the moving member 7 may not be provided in the through holes 62 of the two, four or more support bars 61.

Figure 9:
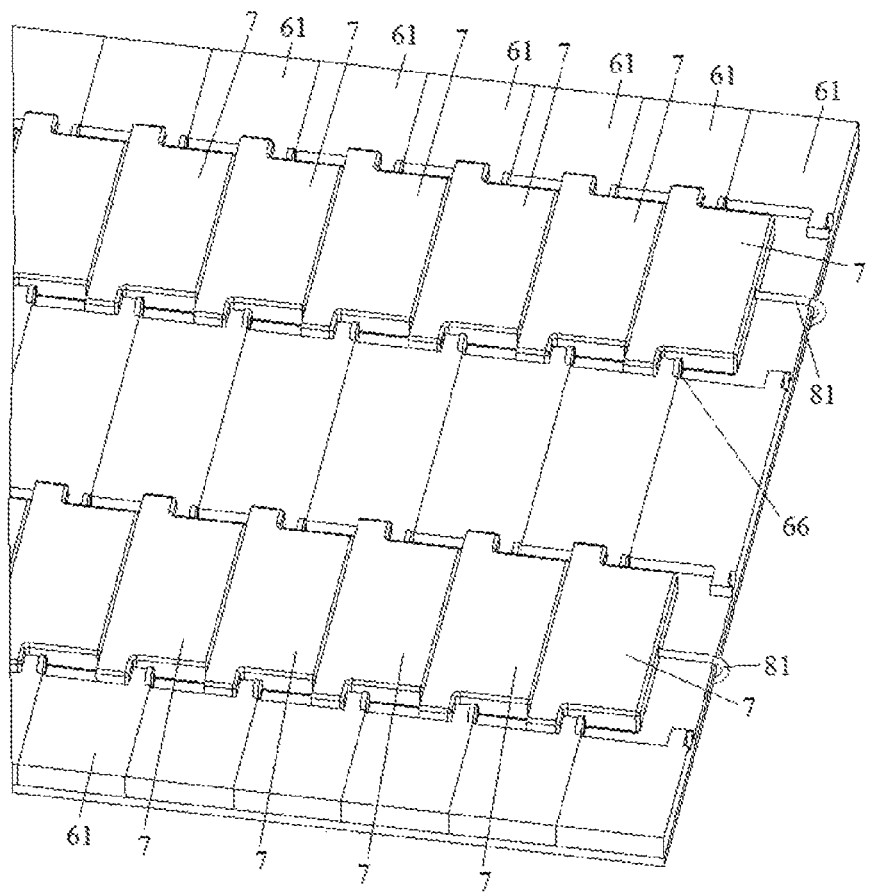
FIG. 9 is a schematic cross-sectional view of the matching structure of the moving member and the support bar when the flexible display device is fully stretched.
Figure 10:
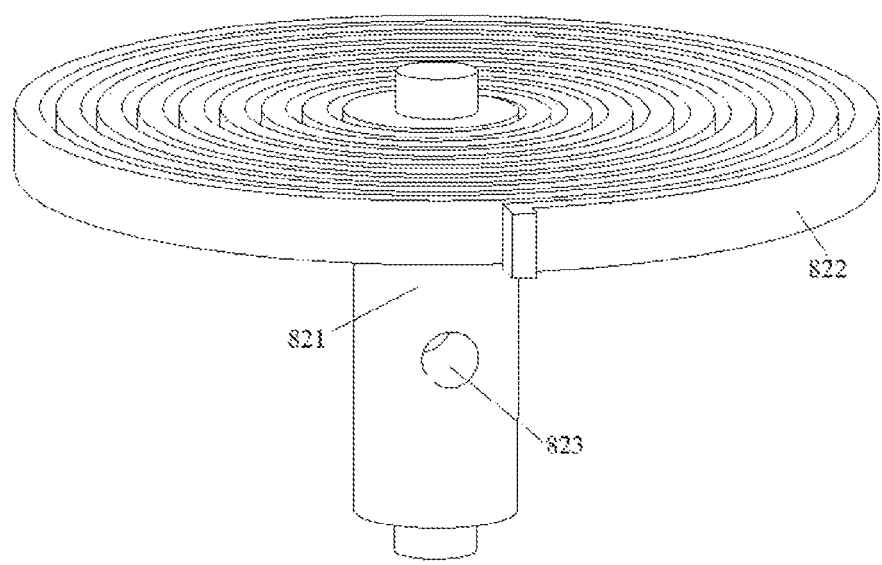
FIG. 10 is a schematic diagram of the structure of the rewinding shaft and the first scroll spring in the drawstring retractor.

Referring to the schematic cross-sectional view of the matching structure of the moving member and the support bar when the flexible display device is fully stretched shown in FIG. 9, the cross-sectional surface of FIG. 9 is parallel to the flexible display panel 1. When the flexible display device is in a fully stretched state, one moving member 7 is located in the two through holes 62 of two adjacent support bars 61, so that the support member 6 is formed as a rigid plane that cannot be bent, to support the flexible display panel 1. The support bar 61 and the moving member 7 in FIG. 9 are cross-sectional views cut along the center line, not a complete support bar 61, which aims to more intuitively introduce the positional relationship and movement principle of the internal structure of the support member.

In other exemplary embodiments of the present invention, the position of the boss 65 in the through hole 62 may be opposite to that in the above exemplary embodiment. Specifically, the boss 65 is located on the side of the through hole 62 close to the winding shaft 2.

To realize the change from the state in FIG. 8 to the state in FIG. 9, the position of the moving member 7 in the through hole 62 needs to be adjusted by the adjustment mechanism 8. The adjustment mechanism 8 is sequentially connected to a plurality of moving members 7.

In this example embodiment, the adjustment mechanism 8 may include two drawstrings 81 and two drawstring retractors 82. Each drawstring 81 sequentially penetrates and connects a plurality of moving members 7, and pulling the drawstring 81 can drive the moving member 7 to move. Specifically, one end of the drawstring 81 is fixed on the moving member 7 closest to the winding shaft 2, and the drawstring 81 passes through the fifth through hole 74 of the moving member 7 successively, and is an interference fit with the fifth through hole 74, so that the drawstring 81 can drive the moving member 7 to move. After the drawstring 81 passes through all the moving members 7 successively, it goes around to the side of the support member 6 away from the flexible display panel 1 and is located in the groove 64 on the support bar 61. The other end of the drawstring 81 is connected to the drawstring retractor 82 through the via hole 35 on the housing 3.

The drawstring retractor 82 is arranged on the housing 3 and is located on the side of the opening away from the flexible display panel 1. The other end of the drawstring 81 is connected to the drawstring retractor 82. A pulling force of the drawstring retractor 82 on the drawstring 81 increases as an amount of pull-out of the drawstring 81. Referring to the structural schematic diagram of the drawstring retractor shown in FIG. 10, the drawstring retractor 82 may include a rewinding shaft 821 and a first scroll spring 822. The housing 36 may be configured in a cylindrical shape, and may be fixed on the second connecting plate 34 of the housing 3. The axial direction of the housing 36 is perpendicular to the axial direction of the winding shaft 2. The rewinding shaft 821 is arranged in the housing 36. One end of the rewinding shaft 821 can be connected to the housing 3 through a bearing, so that the rewinding shaft 821 can rotate. The rewinding shaft 821 is provided with a sixth through hole 823. The axial direction of the sixth through hole 823 is perpendicular to the axial direction of the rewinding shaft 821, and the other end of the drawstring 81 passes through the sixth through hole 823 and is fixedly connected to the rewinding shaft 821. The other end of the rewinding shaft 821 is fixedly connected to one end of the first scroll spring 822, and the other end of the first scroll spring 822 is fixed to the inner side wall of the housing 36.

In addition, in some other exemplary embodiments of the present invention, the rewinding shaft 821 may be arranged in parallel with the winding shaft 2. The first scroll spring 822 is arranged in two. The two first scroll springs 822 are correspondingly connected to the opposite sides of the rewinding shaft 821. That is, one end of the rewinding shaft 821 is connected with a first scroll spring 822, the other ends of the two first scroll springs 822 are both fixed to the inner side wall of the housing 36, and the other end of the drawstring 81 is still fixed to the rewinding shaft 821. Such setting can make the force of the rewinding shaft 821 more balanced, not easy to be jammed, and facilitate the smooth progress of the roll-up. The drawstring retractor 82 may also not be provided, and the user can manually pull the drawstring 81 to drive the moving member 7 to move.

When the flexible display device is in the rewinding state, a moving member 7 can be completely located in the through hole 62 of a support bar 61, and the first magnet 66 and the second magnet 76 are attracted. That is, the side of the boss 65 away from the winding shaft 2 contacts with the side of the protruding part 75 close to winding shaft 2, so that the support member 6 can be wound on the winding shaft 2 with the flexible display panel 1. At this time, a part of the drawstring 81 is wound on the rewinding shaft 821, and a part of the drawstring 81 is threaded on the moving member 7. When the flexible display device is unfolded, the user manually pulls out the flexible display panel 1 and the support member 6, the flexible display panel 1 and the support member 6 will drive the two second scroll springs 4 to twist and curl. The support member 6 drives the drawstring 81 to extend out of the housing 36. When the drawstring 81 extends out of the casing 36, the rewinding shaft 821 will be driven to rotate, and the rotation of the rewinding shaft 821 will drive the first scroll spring 822 to twist and curl. As the length extending outward from the flexible display panel 1 and the support member 6 is longer, the torsion force generated by the second scroll spring 4 is also greater, and the length of the drawstring 81 extending out of the housing 3 is also longer, the degree of torsion and curl of the first scroll spring 822 is also increasing, and the torsion force generated by the first scroll spring 822 is also increasing. When the flexible display device is fully unfolded, the pull-out length of the drawstring 81 reaches the maximum, and the torsion force generated by the first scroll spring 822 also reaches the maximum. At this time, the pull force on the drawstring 81 reaches the maximum, and the pulling force of drawstring 81 on the moving member 7 also reaches the maximum, which is greater than the attractive force between the first magnet 66 and the second magnet 76. Therefore, the drawstring 81 pulls the moving member 7 to move in the through hole 62, so that a moving member 7 is located in two through holes 62 of adjacent two support bars 61, the side of the protrusion part 75 away from the winding shaft 2 contacts with the side of the other boss 65 close to the winding shaft 2, and the boss 65 contacts with the protrusion part 75 to limit the moving distance of the moving member 7, so that the support member 6 is formed as a rigid plane that cannot be bent, to support the flexible display panel 1.

After completing the use, the user toggles the handle 53, to disengage the pawl 52 from the ratchet 51, and then releases the support member 6 and the flexible display panel 1. Under the driving by the torsional force of the second scroll spring 4, the winding shaft 2 rotates, thereby driving the support member 6 and the flexible display panel 1 to retract and wind on the winding shaft 2. At the same time, the first scroll spring 822 drives the winding shaft 821 to rotate, thereby driving the drawstring 81 to retract and wind on the rewinding shaft 821. The torsion force of first scroll spring 822 gradually decreases, when the attractive force between the first magnet 66 and the second magnet 76 is greater than the torsion force of the first scroll spring 822, the first magnet 66 and the second magnet 76 are attracted, such that one moving member 7 can be completely located in the through hole 62 of one support bar 61, to complete the roll-up of the flexible display device.

The moving member 7 can be automatically adjusted by the drawstring 81 and the drawstring retractor 82, and after the use is completed, the second scroll spring 4 can realize automatic roll-up, without manual operation by the user, which is very convenient.

The features, structures, or characteristics described above can be combined in one or more embodiments in any suitable manner. If possible, the features discussed in the embodiments are interchangeable. In the above description, many specific details are provided to give sufficient understanding of the embodiments of the present invention. However, those skilled in the art will realize that the technical solutions of the present invention can be practiced without one or more of the specific details, or other methods, components, materials, etc. can be used. In other cases, well-known structures, materials, or operations are not shown or described in detail to avoid obscuring aspects of the present invention.

Although relative terms such as "above" and "under" are used herein to describe the relationship of one component relative to another component, such terms are used herein only for the sake of convenience, for example, in the direction shown in the figure. It should be understood that if the referenced device is inversed upside down, a component described as "above" will become a component described as "under". When a structure is described as "above" another structure, it probably means that the structure is integrally formed on another structure, or, the structure is "directly" disposed on another structure, or, the structure is "indirectly" disposed on another structure through an additional structure.

In this specification, the terms "one", "a", "the" and "said" are used to indicate the presence of one or more elements/components/etc.; the terms "including", "including" and "having" are used to indicate open-ended inclusive meaning and means that in addition to the listed elements/components/etc., there may be other elements/components/etc.; the terms "first", "second" and "third" etc. are only used as a mark, not limitation to the number of objects. It should be understood that the present invention does not limit its application to the detailed structure and arrangement of the components proposed in this specification. The present invention can have other embodiments, and can be implemented and executed in various ways. The aforementioned deformations and modifications fall within the scope of the present invention. It should be understood that the present invention disclosed and defined in this specification extends to all alternative combinations of two or more individual features mentioned or obvious in the text and/or drawings. All these different combinations constitute multiple alternative aspects of the invention. The embodiments described in this specification illustrate the best mode known for implementing the present invention, and will enable those skilled in the art to utilize the present invention.

What is claimed is:

1. A flexible display device, comprising:
   a housing, with an opening provided thereon;
   a winding shaft, arranged in the housing;
   a flexible display panel, having one end connected to the winding shaft, and an opposite end extending out of the housing through the opening;
   a support member, having one end connected to the winding shaft, and an opposite end extending out of the housing through the opening, wherein the support member comprises a plurality of support bars arranged side by side, and a length direction of the support bars is consistent with an axial direction of the winding shaft, and each of the support bars is provided with a through hole, and the through hole penetrates two end faces of the support bars in a width direction;
   a plurality of moving members, wherein at least a part of the through holes are provided with the moving members, and a dimension of the moving member in the width direction of the support bar is less than or equal to a width of the support bar;
   an adjustment mechanism, comprising a drawstring connected to the plurality of moving members successively, and the drawstring is able to drive the moving member to move, so as to adjust a position of the moving member in the through hole, to make the support member form a rigid plane to support the flexible display panel.

2. The flexible display device according to claim 1, wherein the adjustment mechanism further comprises:
   a drawstring retractor, connected to the housing and arranged on a side of the opening away from the flexible display panel, wherein one end of the drawstring is connected to the drawstring retractor, and a pulling force of the drawstring retractor on the drawstring increases as an amount of pull-out of the drawstring.

3. The flexible display device according to claim 2, wherein the drawstring retractor comprises:
a rewinding shaft, connected to one end of the drawstring;
a first scroll spring, having one end fixed on the housing, and the other end fixedly connected to an end of the rewinding shaft.

4. The flexible display device according to claim 3, wherein the rewinding shaft is arranged perpendicular to the winding shaft, one end of the rewinding shaft is rotatably connected to the housing, and an opposite end of the rewinding shaft is connected to the first scroll spring.

5. The flexible display device according to claim 3, wherein the rewinding shaft is arranged parallel to the winding shaft, the first scroll spring is provided in two, and the two first scroll springs are correspondingly connected to opposite two ends of the rewinding shaft.

6. The flexible display device according to claim 3, wherein a groove for accommodating the drawstring is provided on a side of the support bar away from the flexible display panel.

7. The flexible display device according to claim 6, wherein the moving member is provided with a fifth through hole for the drawstring to pass through.

8. The flexible display device according to claim 7, wherein one end of the drawstring is fixed to a moving member closest to the winding shaft, and the drawstring passes through the fifth through hole on the plurality of moving members successively and is wound into the groove on the side of the support bar away from the flexible display panel, and the other end of the drawstring is fixed to the rewinding shaft.

9. The flexible display device according to claim 2, wherein a boss is provided in the through hole, and the boss is located on a side of the through hole away from the winding shaft, and a protrusion part is provided on the moving member, the protrusion part is provided on a side surface of the moving member close to a hole wall of the through hole and is located on a side close to the winding shaft, and the boss contacts the protrusion part to restrict a movement distance of the moving member.

10. The flexible display device according to claim 2, wherein a boss is provided in the through hole, and the boss is located on a side of the through hole close to the winding shaft, and a protrusion part is provided on the moving member, the protrusion part is provided on a side surface of the moving member close to a hole wall of the through hole and is located on a side close to the winding shaft, and the boss contacts the protrusion part to restrict a movement distance of the moving member.

11. The flexible display device according to claim 9, wherein the flexible display device further comprises:
a restoration mechanism, provided on one or two of the support member and the moving member, and the restoration mechanism is used to drive the moving member to move when the flexible display device is rolled up, so that the support member is able to curl.

12. The flexible display device according to claim 11, wherein the restoration mechanism comprises:
a first magnet, arranged on the boss, wherein the first magnet is located on a side of the support bar away from the winding shaft, and the first magnet is able to be attracted with the moving member in the through hole on the adjacent support bar on the side away from the winding shaft.

13. The flexible display device according to claim 12, wherein the restoration mechanism further comprises:
a second magnet, arranged on the protrusion part, wherein the second magnet is located on a side of the moving member close to the winding shaft, and the second magnet is able to be attracted with the first magnet on the adjacent support bar on the side close to the winding shaft.

\* \* \* \* \*